United States Patent
Welbers et al.

(10) Patent No.: US 6,459,555 B1
(45) Date of Patent: *Oct. 1, 2002

(54) INTEGRATED CIRCUIT COMPRISING ANALOG AND DIGITAL SUB-CIRCUITS WITH IMPROVED OVER-VOLTAGE PROTECTION AND REDUCED SUBSTRATE-NOISE COUPLING

(75) Inventors: Antonius P. G. Welbers, Birrwil (CH); Hans-Ulrich Schröder, Achim (DE)

(73) Assignee: Koninklijke Philips Electronics N.V., Eindhoven (NL)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/430,784

(22) Filed: Nov. 9, 1999

(30) Foreign Application Priority Data

Nov. 9, 1998 (EP) .............................. 98203757

(51) Int. Cl.$^7$ .................................. H02H 9/00
(52) U.S. Cl. .................. 361/91.1; 361/56; 361/111; 361/91.5
(58) Field of Search .................... 361/56, 91.1, 111, 361/91.5

(56) References Cited

U.S. PATENT DOCUMENTS

| | | | |
|---|---|---|---|
| 5,491,358 A | 2/1996 | Miyata | 257/546 |
| 5,693,973 A | 12/1997 | Nakano et al. | 257/355 |
| 5,859,758 A * | 1/1999 | Kim | 361/111 |
| 5,926,353 A | 7/1999 | Misek | 361/56 |
| 5,991,135 A * | 11/1999 | Saleh | 361/56 |
| 6,002,568 A * | 12/1999 | Ker et al. | 361/111 |
| 6,075,686 A * | 6/2000 | Ker | 361/56 |

FOREIGN PATENT DOCUMENTS

EP    0688079 A2    12/1995

OTHER PUBLICATIONS

"Effect Of Substrate Contact On ESC Failure Of Advanced COMS Integrated Circuits", Y. Wei Et Al, EOS/ESD/Symposium 1993, pp. 221–224.

"Effect of Substrate Contact on ESD Failure of Advanced CMOS Integrated Circuits", Y. Wei et al, EOS/EDS/Symposium 1993, pp. 221–224. (No Month).

* cited by examiner

Primary Examiner—Stephen W. Jackson
(74) Attorney, Agent, or Firm—Steven R. Biren

(57) ABSTRACT

An integrated circuit comprising a substrate with analog and digital sub-circuits provided with different supply terminals, including $V_{dd}$ and $V_{ss}$ supply terminals for the analog part and a $V_{dd}$ supply terminal for the digital part, as well as a common substrate terminal or ground terminal. In the substrate, an element with diode function is formed between the $V_{dd}$ and $V_{ss}$ supply terminals of an analog sub-circuit, which element with diode function comprises a cathode part connected to the $V_{dd}$ supply terminal and an anode part connected to the $V_{ss}$ supply terminal of the relevant analog sub-circuit. The supply terminals are further connected to the substrate terminal or ground terminal via over-voltage protection circuits, said over-voltage protection circuits for the relevant analog sub-circuit being embodied so as to be active only for positive over-voltages on a supply terminal with respect to the substrate.

6 Claims, 2 Drawing Sheets

INTEGRATED CIRCUIT COMPRISING ANALOG AND DIGITAL SUB-CIRCUITS WITH IMPROVED OVER-VOLTAGE PROTECTION AND REDUCED SUBSTRATE-NOISE COUPLING

BACKGROUND OF THE INVENTION

The invention relates to an integrated circuit comprising a substrate with analog and digital sub-circuits provided with different supply terminals, inter alia $V_{dd}$ and $V_{ss}$ supply terminals for the analog part and a $V_{dd}$ supply terminal for the digital part, and with a common substrate terminal or ground terminal, the supply terminals being connected to the substrate terminal or ground terminal via over-voltage protection circuits.

An integrated circuit of this type, comprising analog and digital circuit parts, is known from European patent application 0.688.079.

Substrate currents caused by switching transistors form a source of noise within integrated circuits with mixed analog and digital signals. This substrate noise may disturb sensitive analog circuits, such as receiver circuits for mobile radio communication. In order to preclude this, the analog circuits in question should be designed so as to be insensitive to substrate noise.

In integrated circuits of, for example, the CMOS type ("Complementary-Metal-Oxide-Semiconductor") comprising a low-impedance substrate, the substrate currents can enter the circuits from the bottom of the substrate.

To preclude this, the analog circuits should be formed in the substrate so as to be isolated from said substrate. This isolation is effective only if MOS-technology is used without source/substrate connections. Only then the analog circuit part has a "clean" analog ground, which is not connected to the substrate.

Persons skilled in the art know that integrated circuits also have to be protected against damage caused by electrostatic discharge ("Electro Static Discharge") (ESD), which is characterized by pulses of a high voltage (a few kV), a short duration (a few ns) and an average current intensity (a few A). The human body, electric fields generated by machines, and such, are sources of ESD which are well-known in practice.

In the case of mixed (digital and analog) integrated circuits, the analog part of which is isolated from the substrate, the problem arises that the path for ESD currents is not defined when the $V_{ss}$ supply terminal of the analog part is not connected to the substrate. In particular over-voltages on the supply terminals of the analog circuits may then lead to interference and damage.

In practice, generally two techniques are employed to solve this problem. On the one hand, a "bonding" technique is employed, whereby the relevant $V_{ss}$ supply terminal is electroconductively connected to the substrate, or, on the other hand, a technique whereby anti-parallel-connected diodes are incorporated between the analog $V_{ss}$ supply terminal and the substrate. However, both measures lead to an undesirable increase of the substrate noise coupling via the $V_{ss}$ supply terminal.

In general, it applies that there is a correlation between optimum ESD protection and minimum noise coupling. A direct, electroconductive connection between the $V_{ss}$ supply terminal of the analog sub-circuits and the substrate is optimal from the point of view of ESD. Complete electrical insulation, on the other hand, is optimal for achieving a minimum substrate noise coupling.

Studies into ESD phenomena have shown that overvoltages between the $V_{dd}$ supply terminal of the analog part (hereinafter referred to as analog $V_{dd}$ supply terminal, for short) and the analog $V_{ss}$ supply terminal are the principal cause of internal errors in the analog part. Reference is made, inter alia, to Wei et.al., "Effect of Substrate Contact on ESD Failure of Advanced CMOS Integrated Circuits", EOS/ESD Symposium 1993, pp. 221–224.

These errors can be attributed to, inter alia, a "latch up" or "snap back" caused by ESD, as a result of which, in MOS transistors with a floating gate or a grounded gate, an over-voltage on an $n^+$ or $p^+$ diffusion region causes a bipolar effect to be maintained in the reverse direction beyond the avalanche breakdown voltage and it causes a relatively high current flow. Particularly, small diffusion regions connected to the analog $V_{ss}$ supply terminal run the risk of damage by the "latch up" or "snap back" effect.

Partly because of their "snap back" properties, MOS transistors are generally used in practice as over-voltage protection circuit or as a protection against ESD. This can be attributed to the fact that customary bipolar diodes do not protect sufficiently against ESD phenomena owing to their higher differential resistance and higher power dissipation during avalanche breakdown in the reverse direction, so that, according to the currently prevailing design principles for ESD protection, persons skilled in the art generally do not use said bipolar diodes. MOS transistors with a grounded gate, on the other hand, do exhibit a sufficiently low differential resistance in the reverse direction to neutralize ESD over-voltages, which can be partly attributed to the "latch up" or "snap back" effect.

SUMMARY OF THE INVENTION

It is an object of the invention to provide both an improved ESD protection and a reduced substrate noise coupling in an integrated circuit of the mixed type, i.e. comprising mutually isolated digital and analog circuit parts.

In accordance with the invention, this object is achieved in that, an element having a diode function is formed in the substrate between the $V_{dd}$ and $V_{ss}$ supply terminals of an analog sub-circuit, which element comprises a cathode part which is connected to the $V_{dd}$ supply terminal and an anode part which is connected to the $V_{ss}$ supply terminal of the relevant analog sub-circuit, and the over-voltage protection circuits for the analog sub-circuit are embodied so as to act only in the case of positive over-voltages on a supply terminal with respect to the substrate.

The relevant over-voltage protection circuits in combination with the diode element arranged in the above-mentioned manner provide, in contravention to the customary design rules, an effective protection against ESD, which comes as a surprise to experts in the field of ESD over-voltage protection in power supplies.

The fact is that the diode element, which is arranged in the reverse direction between the analog $V_{dd}$ and $V_{ss}$ supply terminals, forms a well-defined over-voltage path for negative over-voltages on the analog $V_{dd}$ supply terminal with respect to the analog $V_{ss}$ supply terminal. In the case of a negative over-voltage on the analog $V_{dd}$ supply terminal, the ESD current caused thereby will flow through the relevant diode element, not through the analog circuit part. Positive over-voltages on the analog supply terminals are handled by the relevant over-voltage protection circuits.

It can be additionally realized that the single diode element in accordance with the invention, in combination with the "positive" over-voltage protections between the supply terminals and the substrate, provides an improved substrate noise coupling, as opposed to, for example, antiparallel arranged diodes, for which it holds that throughout the relevant noise-voltage area between the substrate and the analog $V_{ss}$ supply terminal, a relatively large diffusion capacitance, in the forward direction, of each time one of the relevant diodes is available.

Consequently, the invention combines a reduced substrate noise coupling with an improved ESD behavior. To persons skilled in the art it will be clear that this is a great advantage for integrated circuits comprising both digital and analog sub-circuits.

The over-voltage protection circuits, which are connected to the supply terminals and the substrate terminal or ground terminal, may be of the thick field-oxide type or may comprise a MOS transistor which is connected with its drain to the substrate terminal or ground terminal, such as a N-channel MOS transistor.

In a further embodiment, the element with diode action is provided by one or more adjacent p-n junctions formed in the substrate, which p-n junctions may be, respectively, $p^+$ and $n^+$ diffusion regions.

The invention will be explained in greater detail hereinbelow with reference to the Figures representing circuit diagrams.

DESCRIPTION OF THE PREFERRED EMBODIMENTS

In the so-called "mixed signal" integrated circuits, wherein both analog and digital circuits are formed in the same substrate, substrate currents flowing through switching transistors of the digital circuit part may cause a disturbing noise in the sensitive analog circuit part. Examples of such circuits are the so-called "Application Specific Integrated Circuits (ASICs)" as used in receiving and control circuits of current mobile radio telephones. The analog receiver circuits formed therein should possess a high sensitivity in order to provide for an interference-free range of reception which is as large as possible.

If shielding of the analog circuit part from the digital circuits is impossible as is the case, for example, in integrated circuits of the CMOS type having a low-impedance substrate, then the analog circuits should be formed in said substrate so as to be isolated from the substrate. In such a case, the analog circuit part has a "clean", i.e. free of noise and other disturbances, ground supply terminal or $V_{ss}$ supply terminal.

Figure 1:
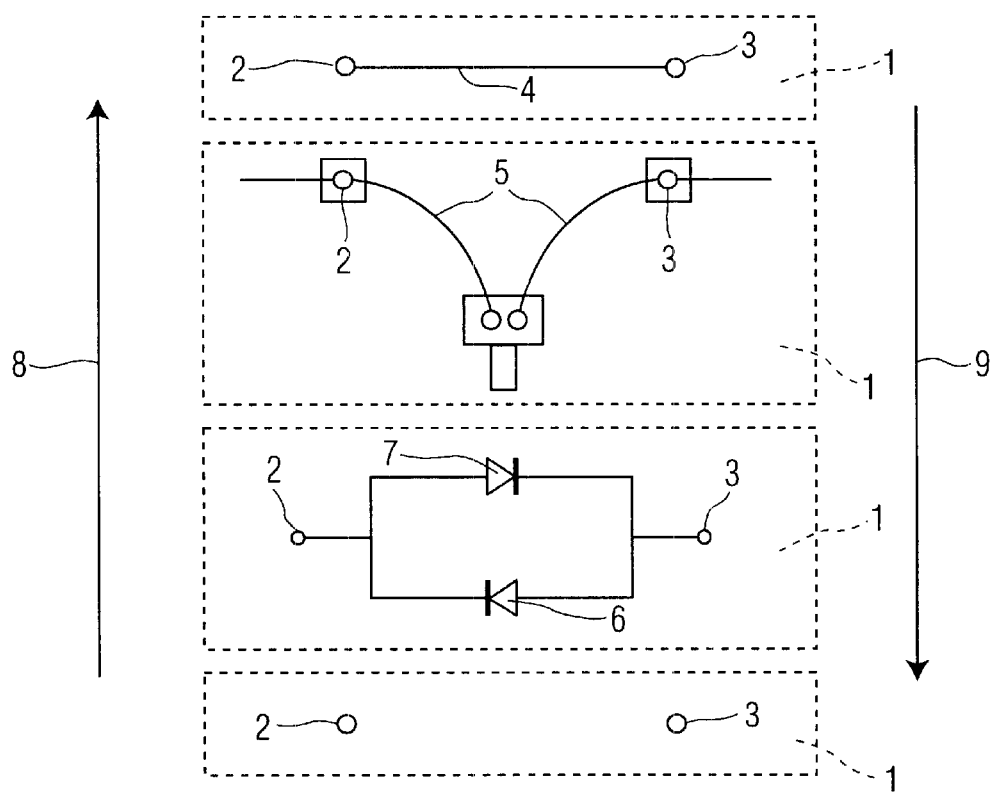
FIG. 1 diagrammatically shows, in an illustrative manner, the correlation between ESD protection and substrate noise coupling, in integrated circuits comprising isolated analog sub-circuits in accordance with the state of the art.

This situation is illustrated at the bottom of FIG. 1 by a $V_{ss}$ supply terminal 2 of the analog circuit part (analog $V_{ss}$ supply terminal) and, electrically insulated therefrom, a ground or substrate terminal 3 of an integrated circuit 1. This condition provides for a minimal noise coupling from the substrate of the integrated circuit 1 to the analog circuit part via the analog $V_{ss}$ supply terminal 2. However, this situation is by no means optimal for ESD protection. The reason for this being that over-voltages on the supply terminal cannot be neutralized towards the ground or substrate terminal 3, simply because no electric path is defined between them. This may result in undesirable currents through and damage to the analog circuit part.

The best possible protection against ESD is provided by the configuration in the upper part of FIG. 1, wherein the analog $V_{ss}$ supply terminal 2 is directly electroconductively 4 connected to the ground or substrate terminal 3 of the integrated circuit 1. In this case, however, also the noise coupling path from the substrate to the analog circuit part is optimal, so that there is a great risk of disturbances in the sensitive analog circuits.

Reference numeral 5 indicates an electrical connection, obtained by bonding, between the analog $V_{ss}$ supply terminal 2 and the substrate terminal 3. A further reduction of the substrate noise coupling is provided by two diodes 6, 7 which are parallel-arranged between the $V_{ss}$ supply terminal 2 and the substrate terminal 3, however, they simultaneously cause a reduction of the protection against over-voltage. Here, noise is coupled in via the relatively large diffusion capacitance in the forward direction of each time one of the diodes throughout the relevant noise-voltage region between the substrate terminal and the analog $V_{ss}$ supply terminal 2. In the Figure, the arrow 8 points in the direction of a better ESD protection, while the arrow 9 points in the direction of a smaller substrate-noise coupling.

Figure 2:
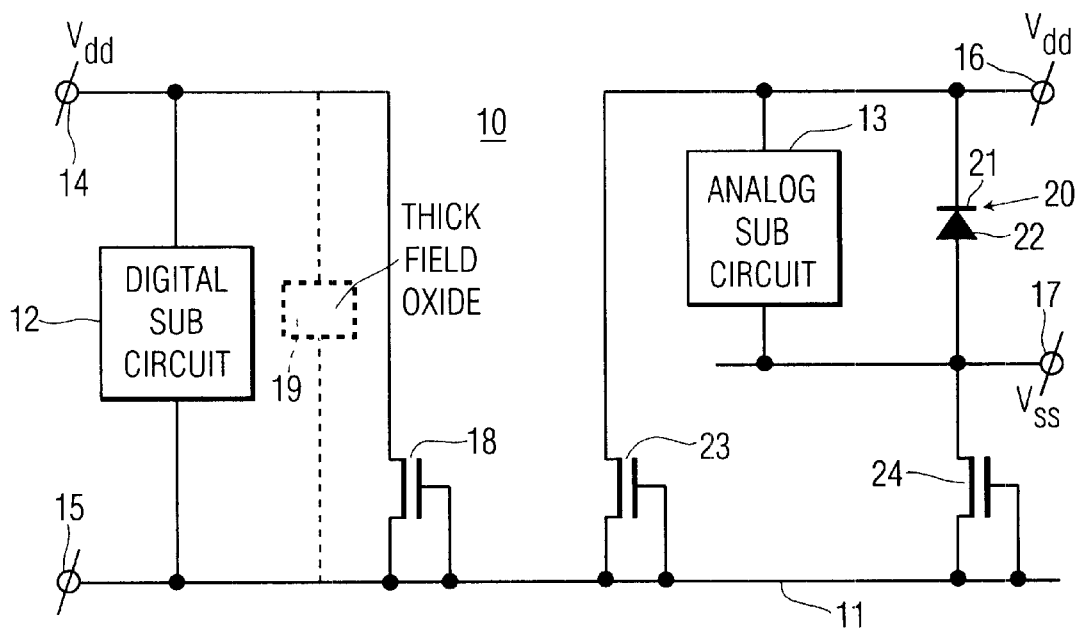
FIG. 2 diagrammatically shows the principle of the invention as applied to an integrated circuit comprising analog and digital sub-circuits.

FIG. 2 shows the concept of a "mixed signal"-type integrated circuit 10 in accordance with the invention, which is optimized for ESD protection as well as for the coupling-in of substrate noise, the substrate 11 comprising, isolated from each other, digital sub-circuits 12 and analog sub-circuits 13.

The digital sub-circuits 12, which are embodied so as to perform a desired digital switching function, are fed via a digital $V_{dd}$ supply terminal 14 and a substrate terminal or ground terminal 15.

The analog sub-circuit 13, which is designed so as to fulfill a desired analog function, comprises an analog $V_{dd}$ supply terminal 16 and an analog $V_{ss}$ supply terminal 17. The analog sub-circuits 13 are isolated, in the substrate, from the digital sub-circuits 12 by the use of, for example, NMOS transistors without source/substrate connections. In this manner, a "clean" ground terminal $V_{ss}$ 17 is obtained. In this case, the term "clean" is to be taken to mean free of noise coupled in via the substrate 11.

Between the digital $V_{dd}$ supply terminal 14 and the substrate or ground terminal 11, there is arranged an over-voltage protection circuit 18 which serves as a protection against electrostatic discharge, and which, in the embodiment shown, is a NMOS transistor whose drain terminal is connected to the digital $V_{dd}$ supply terminal 14 and whose source terminal is connected to the substrate or ground terminal 15 of the integrated circuit 10. Also the gate terminal of the transistor 18 is connected to the substrate or ground terminal 15. Instead of such a NMOS transistor with grounded gate, use may alternatively be made of a thick field oxide device as an over-voltage protection for ESD protection, as is diagrammatically shown in the block-shaped figure represented by interrupted lines and bearing reference numeral 19.

In accordance with the invention, an element 20 with diode function is formed between the analog $V_{dd}$ supply terminal 16 and the analog $V_{ss}$ supply terminal 17 in the substrate 11, the cathode part 21 of said element 20 being connected to the analog $V_{dd}$ supply terminal 16 and the anode part 22 being connected to the analog $V_{ss}$ supply terminal 17.

In addition, of the analog circuit part 13, the analog $V_{dd}$ supply terminal 16 and the analog $V_{ss}$ supply terminal 17 are connected to the substrate or ground terminal 11 by means of over-voltage protections 23, 24 which are active for positive over-voltages. Although grounded-gate NMOS transistors are shown as the over-voltage protection circuits, use may alternatively be made, of course, of thick field oxide devices.

Although the use of diode elements for over-voltage protection or ESD protection goes against the customary design rules for ESD protection, which prescribe the use of MOS transistors because of their "latch up" or "snap back" effect, the use of a diode element 20 in accordance with the invention leads to an improved ESD protection as well as a reduced coupling-in of noise in comparison with the measures in accordance with the prior art shown in FIG. 1. This can be recognized as follows.

Figure 3:
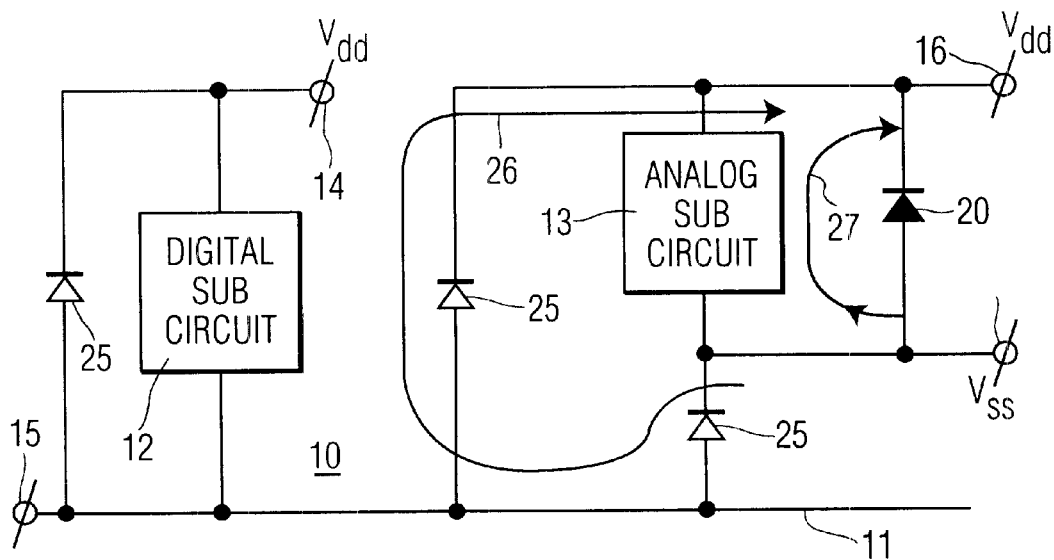
FIG. 3 shows the circuit in accordance with FIG. 2, wherein parts of the circuit are shown in a simplified manner to explain the working principle of the invention.

Reference is made to FIG. 3, in which the relevant over-voltage protections 18, 23 and 24 are represented by a diode symbol 25 for the sake of simplicity. It is noted that in reality these are not diodes but, for example, N-channel MOS transistors or thick field oxide devices as shown in FIG. 2.

The over-voltage protection circuits 23 and 24 provide a well-defined current path for positive over-voltages. A positive over-voltage on the analog $V_{dd}$ supply terminal 16 with respect to the analog $V_{ss}$ supply terminal 17 causes conduction via the NMOS transistor 23 arranged in the reverse direction as well as via the NMOS transistor 24 arranged in the forward direction. All this is illustrated by means of an arrow 26. The diode element 20 in accordance with the invention is active for negative over-voltages on the analog $V_{dd}$ supply terminals 16 with respect to the analog $V_{ss}$ supply terminal 17, as indicated by means of arrow 27.

By merely applying an over-voltage protection 24, in the form of, for example, a NMOS transistor with a grounded gate between the analog $V_{ss}$ supply terminal 17 and the substrate or ground terminal 15, as opposed to anti-parallel arranged diodes 6, 7 known from the prior art and the design rules for ESD protection, the circuit in accordance with the invention has a smaller noise coupling for the negative voltage region.

Figure 4:
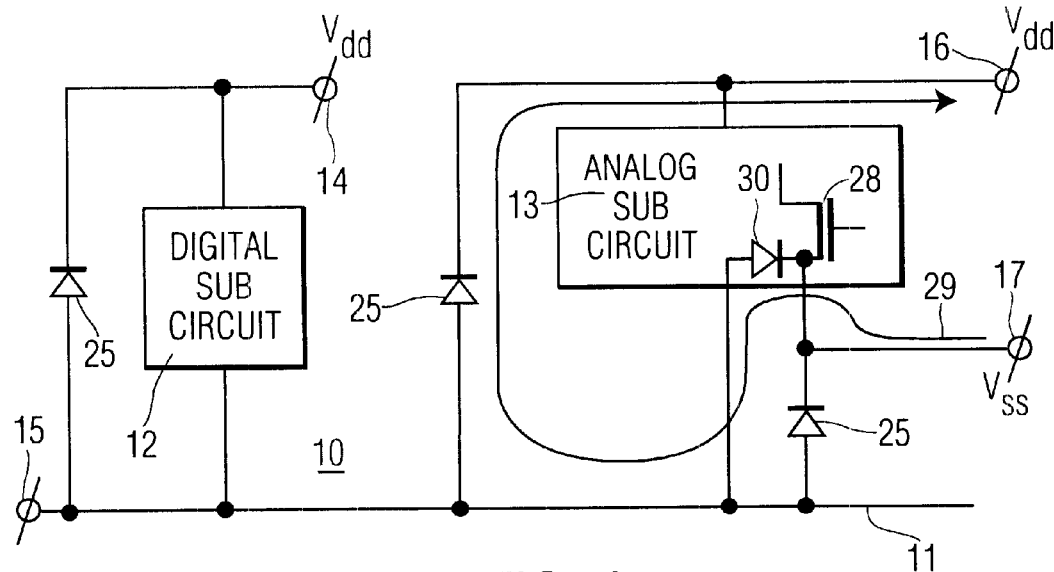
FIG. 4 shows a similar circuit as FIG. 3, yet without the measure in accordance with the invention.

In order to even better illustrate the effect of the diode-function element 20 in the case of ESD, FIG. 4 shows the situation wherein only the supply terminals 16, 17 are connected to the substrate 11 via an over-voltage protection circuit 25.

In the case of a negative voltage on the analog $V_{dd}$ supply terminal 16 with respect to the analog $V_{ss}$ supply terminal 17, a current will flow through an internal parasitic NPN current path 30 in the analog circuit part 13, such as formed, for example, by a $n^+$ source diffusion of a NMOS circuit 28 connected to the analog $V_{ss}$ supply terminal 17 as the emitter, the p-well as the base and an n-well ground contact of a PMOS transistor connected to the analog $V_{dd}$ supply terminal 16 of the analog circuit part 13 of the integrated circuit 10. All this is illustrated by means of arrow 29. Consequently, an internal ESD current path in the analog circuit part 13 cannot be avoided which, in practice, may lead inter alia to damage to the transistor 28.

In other words, a simple element with diode function 22 arranged between the analog supply terminals, in accordance with the invention, provides an improved ESD behavior, which may be regarded as surprising in view of the design rules for ESD protection which reject the use of diode elements as such.

Figure 5:
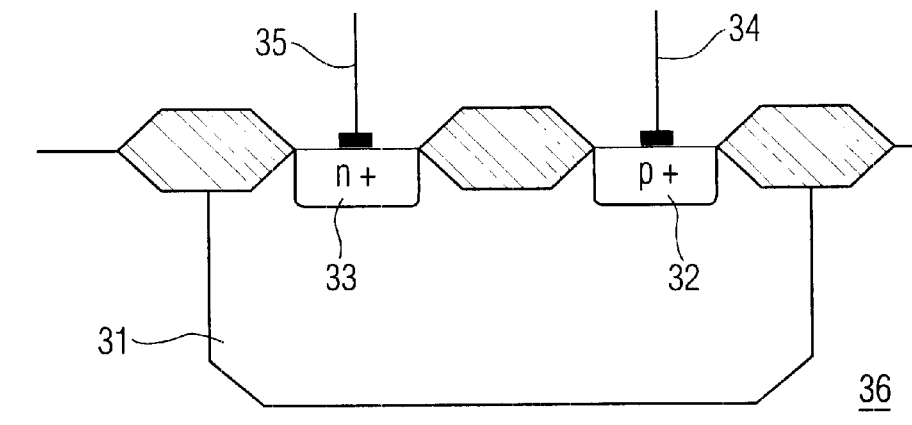
FIG. 5 is a sectional view of an integrated circuit substrate in which a diode element in accordance with the invention is formed.

FIG. 5 diagrammatically shows, in section, a diode element in accordance with the invention having a p-n-junction formed by $p^+$ and $n^+$ diffusion regions 32, 33 in the p-substrate 36, within an n-well 31 formed in said substrate. The $p^+$ diffusion region 32 is provided with a terminal 34 which forms the anode of the diode element, and the $n^+$ diffusion region 33 is provided with a contact 35 which forms the cathode terminal of the relevant diode element.

A direct advantage of the improved ESD behavior of the integrated circuit in accordance with the invention is that CMOS processes of reduced dimensions can be applied in the analog circuit part, particularly in the far sub-micron range.

The invention can also be applied, of course, to integrated circuits with different analog and digital sub-circuits comprising a plurality of $V_{dd}$ and $V_{ss}$ supply terminals.

What is claimed is:

1. An integrated circuit comprising a substrate with analog and digital sub-circuits provided with different supply terminals comprising $V_{dd}$ and $V_{ss}$ supply terminals for the analog part and a $V_{dd}$ supply terminal for the digital part, and with a separate common substrate terminal or ground terminal, the supply terminals being connected to the substrate terminal or ground terminal via over-voltage protection circuits, said over-voltage protection circuits comprising a single diode formed in the substrate between the $V_{dd}$ and $V_{ss}$ supply terminals of an analog sub-circuit, which single diode comprises a cathode part which is connected to the $V_{dd}$ supply terminal and an anode part which is connected to the $V_{ss}$ supply terminal of the analog sub-circuit, and the over-voltage protection circuits are embodied so as to act only in the case of positive over-voltages on a supply terminal with respect to the substrate.

2. An integrated circuit as claimed in claim 1, characterized in that the over-voltage protection circuits comprise a thick field oxide circuit.

3. An integrated circuit as claimed in claim 1, characterized in that the over-voltage protection circuits comprise a MOS ("Metal-Oxide-Semiconductor") transistor which is connected with its source to the substrate terminal or ground terminal.

4. An integrated circuit as claimed in claim 3, characterized in that the MOS transistor is an N-channel MOS transistor.

5. An integrated circuit as claimed in any one of the preceding claims, characterized in that the single diode is formed by one or more p-n junctions formed in the substrate so as to be adjacent to each other.

6. An integrated circuit as claimed in claim 5, characterized in that the p-n junctions are formed by, respectively, $p^+$ and $n^+$ diffusion regions in the substrate.

* * * * *